United States Patent [19]

Arakawa et al.

[11] Patent Number: 4,817,055
[45] Date of Patent: Mar. 28, 1989

[54] SEMICONDUCTOR MEMORY CIRCUIT INCLUDING BIAS VOLTAGE GENERATOR

[75] Inventors: Hideki Arakawa, Yokohama; Hiromi Kawashima, Kawasaki, both of Japan

[73] Assignee: Fujitsu Limited, Kanagawa, Japan

[21] Appl. No.: 896,785

[22] Filed: Aug. 15, 1986

[30] Foreign Application Priority Data

Aug. 16, 1985 [JP] Japan .................. 60-179441

[51] Int. Cl.[4] .................. G11C 7/00; G11C 11/40
[52] U.S. Cl. .................. 365/189; 365/226; 307/297
[58] Field of Search .......... 307/304, 297, 450, 200 B; 365/189, 226

[56] References Cited

U.S. PATENT DOCUMENTS

| 4,068,140 | 1/1978 | Lou | 307/304 |
| 4,069,430 | 1/1978 | Masuda | 307/304 X |
| 4,195,356 | 3/1980 | O'Connell et al. | 365/78 X |
| 4,368,524 | 1/1983 | Nakamura | 365/226 |
| 4,384,220 | 5/1983 | Segawa | 307/304 X |
| 4,609,833 | 9/1986 | Guterman | 307/304 X |

Primary Examiner—Stuart N. Hecker
Assistant Examiner—Alyssa H. Bowler
Attorney, Agent, or Firm—Armstrong, Nikaido, Marmelstein, Kubovcik

[57] ABSTRACT

A semiconductor memory circuit includes therein a bias voltage generator which produces a bias voltage to be supplied to a control gate of a field effect transistor (FET) which forms a part of each memory cell in the semiconductor memory circuit. The bias voltage generator is comprised of a bias voltage generating source which is sandwiched by first and second FET's. The second FET operates to stop a driving current flowing through the bias voltage generating source, in a standby mode, and the first FET operates to produce an output voltage near to the bias voltage. The bias voltage is generated by the bias voltage generating source when both the first and second FET's are turned ON, in an active mode, and the driving current flows therethrough.

11 Claims, 8 Drawing Sheets

SEMICONDUCTOR MEMORY CIRCUIT INCLUDING BIAS VOLTAGE GENERATOR

BACKGROUND OF THE INVENTION

1. Field of the Invention

The present invention relates to a semiconductor memory circuit which contains therein at least a bias voltage generator for producing a bias voltage of a predetermined level within a range within a power source level and a ground level.

Note: The term "bias voltage" is used in a variety of electronic fields but, in the present invention, this term is used to denote a voltage to be appled to a control gate of each memory cell. To be specific, in a semiconductor memory of an electrically erasable programmable read-only memory (EEPROM) type, each of the memory cells is comprised of a programming transistor and a selecting transistor connected in series. In the EEPROM, the control gate of each programming transistor is applied with a bias voltage having a level in a range between a power source ($V_{cc}$) level and a ground level, for example, 2 to 3 V, when the EEPROM is operated under a read mode, as will be clarified hereinafter.

2. Description of the Related Art

In general, the prior art bias voltage generator, comprised of at least one field effect transistor (FET) pair, is used to produce the desired bias voltage by flowing a certain current through the FET's. In other words, the prior art bias voltage generator cannot produce the desired bias voltage without having a current supplied thereto. Therefore, the prior art bias voltage generator is disadvantageous from the view point of power consumption in the semiconductor memory circuit.

SUMMARY OF THE INVENTION

It is an object of the present invention to provide a semiconductor memory circuit including a bias voltage generator having an improved power consumption when compared to the prior art. That is, the present invention provides a bias voltage generator driver with a much lower power consumption.

The above object of the present invention is attained by incorporating a known complementary metal-oxide semiconductor (CMOS) arrangement into the bias voltage generator. As is known, the CMOS is a combination of n- and p-channel enhancement-mode devices on a single silicone chip connected to a push-pull complementary digital circuit so that a low quiescent power dissipation is realized.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Before describing the embodiments of the present invention, the prior art and the problems therein will be first described with reference to the related figures.

Further, for ease of comprehension, the following explanations will be primarily made by using an EEPROM type semiconductor memory circuit.

Figure 1:
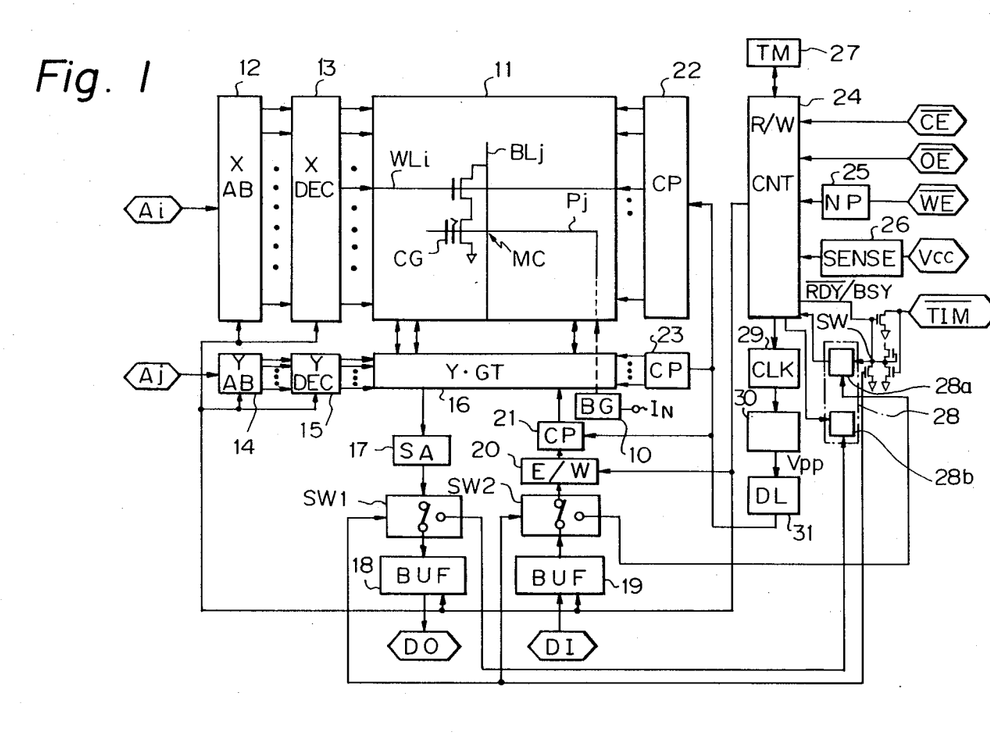
FIG. 1 is an example of an EEPROM type semiconductor memory circuit having therein a bias voltage generator according to the present invention.

FIG. 1 is an example of an EEPROM type semiconductor memory circuit having a bias voltage generator according to the present invention. In FIG. 1, reference numeral 10, shown in the center of the drawing, indicates a bias voltage generator (BG). The bias voltage generator 10 supplies a bias voltage of a predetermined level to the control gate CG of a memory cell MC. The memory cell MC is formed in a semiconductor memory cell array 11 and is accessed by address signals $A_i$ and $A_j$. The X side address signal $A_i$ selects one of the word lines, i.e. $WL_i$, via an X side address buffer circuit (X·AB) 12 including a latch circuit, and an X side decoder (X·DEC) 13. At the same time, the Y side address signal $A_j$ selects one of the bit lines, i.e., $BL_j$, via a Y side address buffer circuit (Y·AB) 14 including a latch circuit, a Y side decoder (Y·DEC) 15, and a Y side gate circuit (Y·GT) 16. The data stored in the selected memory cell MC, also connected with a programming line ($P_j$), is sent to a sense amplifier (SA) 17 via the Y side gate circuit 16 and read as an output data DO via a first switch SW1 and a buffer (BUF) 18. On the other hand, in a write mode, an input data DI is momentarily held in a buffer (BUF) 19 including a latch circuit and sent to the selected bit line $BL_j$ via a second switch SW2, an erase/write control circuit (E/W) 20, a charge pump circuit (CP) 21, and the Y side gate circuit 16. The first switch SW1 is used to write status information in a status register 28b. The status information is watched by a central processing unit (not shown). The second switch SW2 is used to write control information in a control register 28a. The registers 28a and 28b form an internal register 28.

Overall control of the above mentioned read and write operations is achieved by a read/write control circuit (R/W CNT) 24. The R/W control circuit 24 receives a chip enable signal $\overline{CE}$, an output enable signal $\overline{OE}$, a write enable signal $\overline{WE}$, a power source voltage ($V_{cc}$), and a timing signal (TIM). The timing signal is used to access the internal register 28. On the other hand, the read/write control circuit 24 produces a variety of signals, such as a ready/busy signal ($\overline{RDY}/\overline{BSY}$), control signals for the register 28b, a clock circuit 29, the buffers 18, 19, the erase/write control circuit 20, the address buffers 12, 14, and the decoders 13, 15. The clock circuit 29 drives a boosting circuit 30 to produce a high voltage $V_{pp}$ such as 20 V. The high voltage $V_{pp}$ is supplied to the charge pump circuits 21, 22 and 23, via a delay circuit (DL) 31 so as to obtain a voltage $V_{pp}$ having a predetermined rising edge. The read/write control circuit 24 further cooperates with a timer (TM) 27. The erase and write operations usually take, for example, 10 ms. This time of 10 ms is too long when compared with the operation speed of the central processing unit (CPU). Therefore, during the erase and write operations, the EEPROM semiconductor memory circuit is separated from the CPU, and the CPU can proceed with its inherent operation regardless of the memory circuit, for that 10 ms. The 10 ms is defined by the aforesaid timer 27. During the term of 10 ms, major data must be held as is, and therefore, the aforesaid latch circuits are needed.

A noise protection circuit (NP) 25 is used to eliminate noise from the write enable signal $\overline{WE}$, and a sensing circuit 26 is used to supervise the normality of the power source level $V_{cc}$.

In the above-mentioned EEPROM type semiconductor memory circuit, the present invention is particularly concerned with, among the various circuit members, the bias voltage generator (BG) 10 in relation to the memory cells MC. Accordingly, a detailed explanation will be first given regarding the memory cell MC, and then an explanation will be given regarding the bias voltage generator 10.

Figure 2:
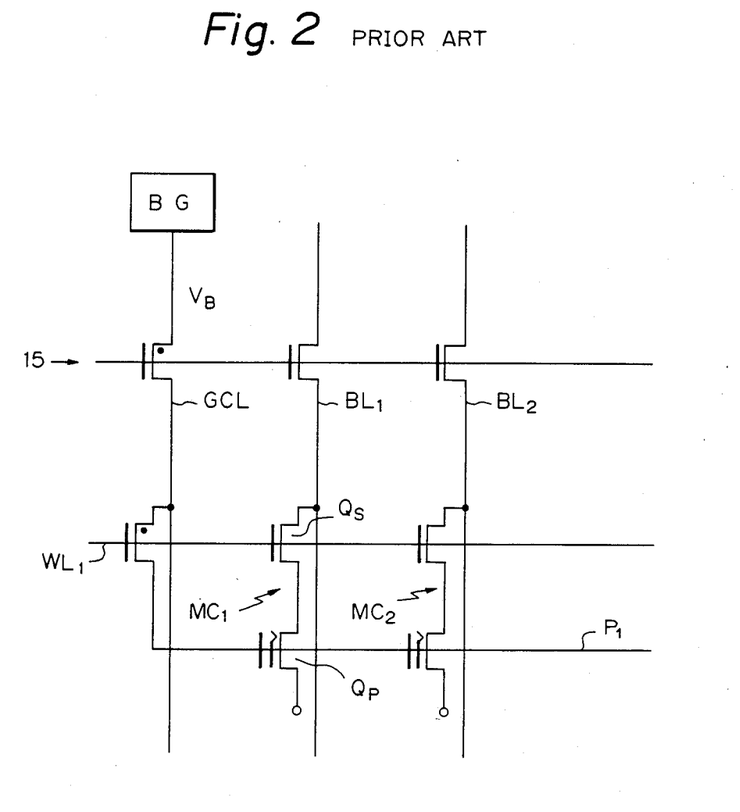
FIG. 2 is a detailed circuit diagram of known memory cells and peripheral elements thereof.

FIG. 2 is a detailed circuit diagram of known memory cells and peripheral elements thereof. The circuit of FIG. 2 is located at a certain part of the semiconductor memory cell array (shown by 11 in FIG. 1). That is, the element shown by the bit lines $BL_1$, $B_2$, the word line $WL_1$, the programming line $P_1$, the memory cells $MC_1$, $MC_2$, and so on. Reference character GCL represents a gate control line connected to each control gate of the memory cells $MC_1$ and $MC_2$. Three FET's shown in top row of the figure correspond to the Y side gate circuit (shown by 16 in FIG. 1), and these FET's receives, at their gates, the output from the Y side decoder (shown by 15 in FIG. 1). Through the Y side decoder, the control gate of each memory cell is connected to the bias voltage generator (BG). Each of the memory cells $MC_1$ and $MC_2$ is comprised of a selecting transistor $Q_s$ and a programming transistor $Q_p$. The transistor $Q_p$ functions as a memory transistor storing data "1" or "0" therein.

Figure 3:
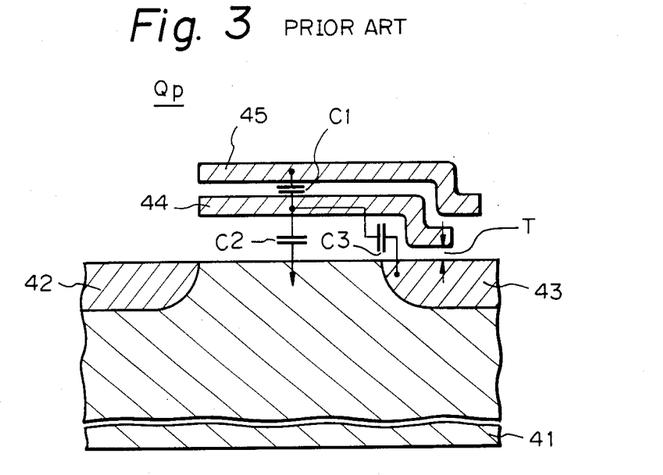
FIG. 3 is a cross-sectional view of a known programming transistor.

FIG. 3 is a cross-sectional view of a known programming transistor. The programming transistor $Q_p$ of FIG. 2 has a construction in cross section as shown in FIG. 3. Note, the usual insulation and other materials are not illustrated in FIG. 3 for simplicity. In the figure, reference numeral 41 represents a semiconductor substrate. A source region 42 and a drain region 43 are formed in the substrate 41. A floating gate 44 and a control gate 45, both made of, for example, policrystalline silicone, are formed above and between the source and drain regions 42 and 43. An end of the floating gate 44 is located close to the drain region 43 with a small thickness T through which a carrier tunneling takes place. Reference characters $C_1$, $C_2$, and $C_3$ indicate capacitors around the floating gate 44. Note, the aforesaid thickness T is usually on the order of 80 to 150 Å.

Referring to FIGS. 2 and 3, the operation of the programming transistor $Q_p$ will be explained below. Here, the terms "erase" and "write" are defined as follows. In the erase state, electrons are injected to the floating gate 44, and thus the programming transistor $Q_p$ is made OFF. In the write state, positive charges are left on the floating gate 44, and thus the programming transistor $Q_p$ is made ON.

When the erase operation is carried out, a voltage of about 20 V is applied to the control gate 45, and therefore, a voltage of at least 14 V is applied to the floating gate 44. Note, since the capacitor $C_1$ is selected to represent 70% of the overall capacity, about 70% of the 20 V (14 V) is applied to the floating gate 44. In these circumstances, when the drain region 43 is left at, for example, 0 V, the electrons are injected, through the tunneling, from the drain region 43 to the floating gate 44, so that the programming transistor $Q_p$ is made OFF.

When the write operation is achieved, the control gate 45 is left at 0 V and the drain region 43 is applied with, for example, about 20 V. Since the capacity $C_3$ is selected to be lower than 10% of the overall capacity, 3 to 5 V is applied to the floating gate 44, and therefore, 17 to 15 V is applied between the floating gate 44 and the drain region 43. In these circumstances, the electrons are injected, through the tanneling, from the floating gate 44 to the drain region 43, so that the floating gate 44 is left in a state wherein there is a shortage of electrons. As a result, positive charges are left on the floating gate 44 to make the transistor $Q_p$ ON. The write operation is completed in this condition.

When the read operation is achieved, the word line $WL_1$ is supplied with the positive power source level $V_{cc}$ of, for example, 5 V; the gate control line GCL is supplied with a predetermined bias voltage $V_B$, which is selected from a voltage range of 2 to 3 V, and the bit lines $BL_1$, $BL_2$ and so on are supplied with a voltage of 1 to 2 V. In this case, the bias voltage $V_B$ (2 to 3 V) creates a critical level to make the programming transistor $Q_p$ either ON or OFF when no carrier exists on the floating gate 44 of the transistor $Q_p$.

The above mentioned erase, write, and read modes can be clarified, in terms of voltages, by the following Table; wherein a plurality of word lines and bit lines are represented by $WL_i$ and $BL_i$, respectively, and GCL is the gate control line.

TABLE

| MODE | $WL_i$ | GCL | $BL_i$ |
|---|---|---|---|
| ERASE | 20 V | 20 V | 0 V |
| WRITE | 20 V | 0 V | 20 V |
| READ | $V_{cc}$ | $V_B$ | 1 to 2 V |

Where the voltage $V_{cc}$ is, for example, 5 V, and the bias voltage $V_B$ is in a range of from 2 to 3 V.

Figure 4:
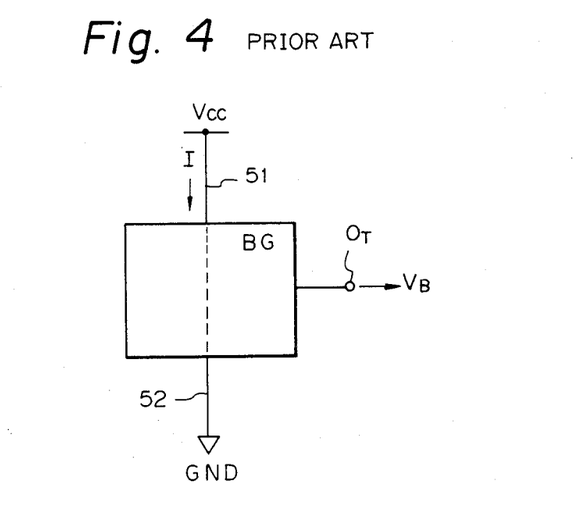
FIG. 4 is a general view of a prior art bias voltage generator.

FIG. 4 is a general view of the prior art bias voltage generator. In FIG. 4, the bias voltage generator BG produces a bias voltage at its output terminal $O_T$ by flowing a drive current I therethrough. The related current path is indicated by 51 and 52. The paths 51 and 52 represent a power source side current path and a ground side current path, respectively. In other words, the bias voltage generator BG is effective for the period in which the drive current I is fed thereto. This means that the drive current I flows regardless of whether the device is in an active mode or in a standby mode. But, as apparent from the previously recited table, the drive current I for producing the bias voltage $V_B$ is required only in an active mode, i.e., read mode.

Figure 5:
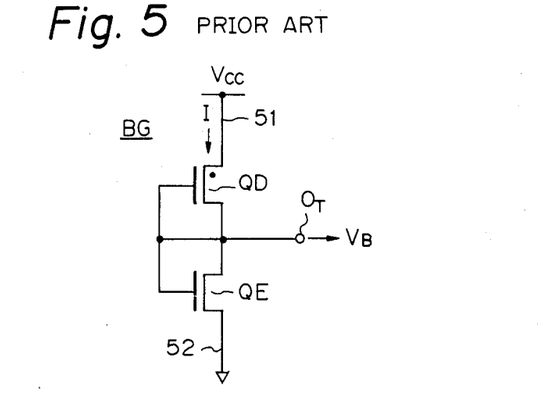
FIG. 5 is a circuit diagram of an example of a prior art bias voltage generator BG.

FIG. 5 is a circuit diagram of an example of a prior art bias voltage generator BG. In the example of FIG. 5, n-channel FET's are used and connected in series. One of the FET's is a depletion type type FET QD and the other is an enhancement type FET QE. The desired bias voltage $V_B$ (2 to 3 V) is obtained at an intermediate connecting point between the two. In this case, the driving current I flows therethrough at any time, and thus the current I flowing during a time other than the read mode, is disadvantageous from the view point of power consumption.

As mentioned previously, the present invention employs the concept of a known CMOS for overcoming this disadvantage. In general, a feature of the CMOS transistor pair is that the driving current cannot flow in the CMOS during a standby mode, and even if a current does flow therethrough, this current is usually as small as about 1 μA or lower.

Accordingly, if such a CMOS is directly adapted to the bias voltage generator BG of FIG. 5, the desired bias voltage $V_B$ would not be obtained during the standby mode. But the bias voltage $V_B$ must be generated during not only the active mode (read mode) but also during the standby mode. From this view point, the prior art bias voltage generator BG of FIG. 5 is suitable, but the problem of the power consumption arises. The bias voltage $V_B$ (or the bias voltage near the voltage $V_B$) must be generated during both the active and standby modes because the predetermined bias voltage $V_B$ must appear immediately after the change from the standby mode to the active mode. If the bias voltage $V_B$ is left at about the $V_{cc}$ level or the ground level during the standby mode, it would take relatively long time, at the change from the standby mode to the active mode, to change to the predetermined bias voltage $V_B$ from the $V_{cc}$ level or the ground level. Consequently, it is important to maintain the output voltage of the bias voltage generator BG to be at or near $V_B$ even in the standby mode, even though the CMOS structure is used in the generator BG.

If the predetermined bias voltage $V_B$ is determined to be, for example, 2.3 V, according to a design of the EEPROM, the variance of the voltage $V_B$ can be within a range of as small as ±0.1 V. As is known, it is almost impossible to maintain such a severe variance condition with the use of the CMOS transistor pair without flowing a driving current therethrough. Further, it is very difficult to obtain an intermediate voltage between the $V_{cc}$ and ground levels with a high degree of accuracy.

According to the present invention, even if a CMOS structure is used in the bias voltage generator BG, a correct bias voltage $V_B$ is obtained during the active mode and a voltage near to the voltage $V_B$ is obtained even during the standby mode. This means, of course, that the power consumption at the standby mode is minimized due to the CMOS structure.

Figure 6:
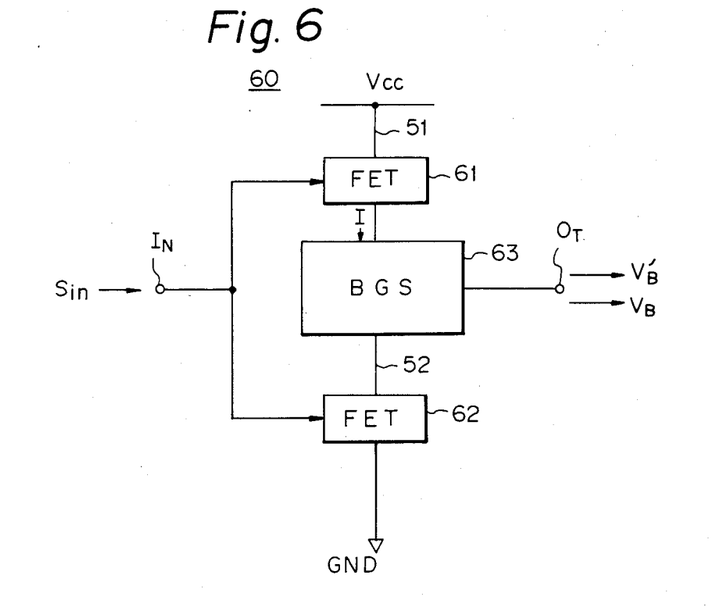
FIG. 6 is a general block diagram of a bias voltage generator according to the present invention.

FIG. 6 is a general block diagram of a bias voltage generator according to the present invention. In FIG. 6, the bias voltage generator 60 is comprised of a first FET 61 and a second FET 62, both forming a CMOS structure receiving a common input signal $S_{in}$ at their gates, and a bias voltage generating source (BGS) 63 producing therefrom an output voltage to be applied to the control gate of the memory cells, i.e., $V_B$ or $V_B'$. The voltage $V_B'$ is near to the voltage $V_B$. The first FET 61 and the second FET 62 are connected in series with the power source side current path 51 and the ground side current path 52. The current paths 51 and 52 carry the driving current through the bias voltage generating source 63 to produce the predetermined bias voltage $V_B$, when the common input signal $S_{in}$ at the input terminal $I_N$ makes the second FET 62 OFF, and at the same time, makes the first FET 61 conductive to produce, as its output, a voltage near to the voltage $V_B$. The above condition also prevails in the standby mode. On the other hand, when the common input signal $S_{in}$ makes both the first and second FET's 61 and 62 ON, the driving current flows through the bias voltage generating source 63 to produce the inherent bias voltage $V_B$. The above condition also prevails in the active mode, i.e., the read mode.

To be specific, the first FET 61 is, for example, an n-channel depletion type FET, and the second FET 62 is, for example, an n-channel enhancement type FET.

Figure 7:
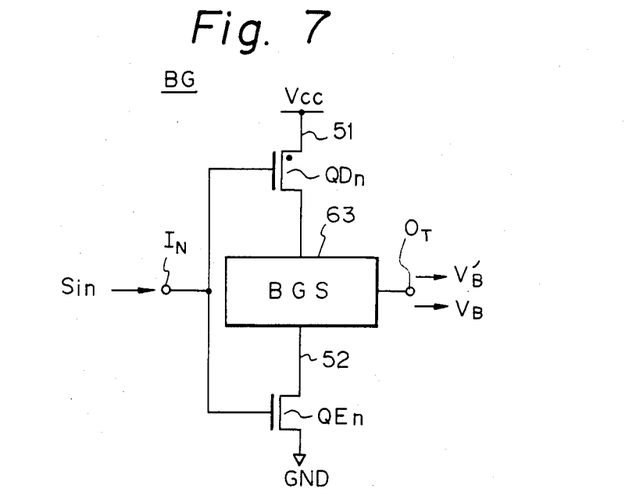
FIG. 7 is a circuit diagram of a bias voltage generator according to an embodiment of the present invention.

FIG. 7 is a circuit diagram of a bias voltage generator according to an embodiment of the present invention. Members identical to those of FIG. 6 are represented by the same reference numerals and characters. In the bias voltage generator BG of FIG. 7, the first FET 61 is preferably an n-channel depletion type (having the symbol "." affixed) FET $QD_n$ and the second FET 62 is preferably an n-channel enhancement type FET $QE_n$. The threshold voltage $V_{th}$ of the FET $QD_n$ is usually in a range of −2 to −3 V, the absolute value of which is not the same as the predetermined bias voltage $V_B$, for example, 2.3 V, but is close to the voltage $V_B$, as denoted by $V_B'$.

The common input signal $S_{in}$ assumes a "L" (low) level when the EEPROM is in the standby mode, and assumes "H" (high) level when the EEPROM is in the active mode. The common input signal $S_{in}$ is not new but substituted by the chip enable signal CE shown top right in FIG. 1. Alternatively, the common input signal $S_{in}$ can be substituted by a so-called chip selection (CS) signal.

In FIG. 7, the depletion type FET $QD_n$ is preferably an n-channel rather than p-channel type. This is because, in general, the threshold voltage $V_{th}$ of an n-channel FET is more easily adjusted than that of a p-channel FET. This makes the output voltage at the output terminal $O_T$ stable and precise.

Figure 8:
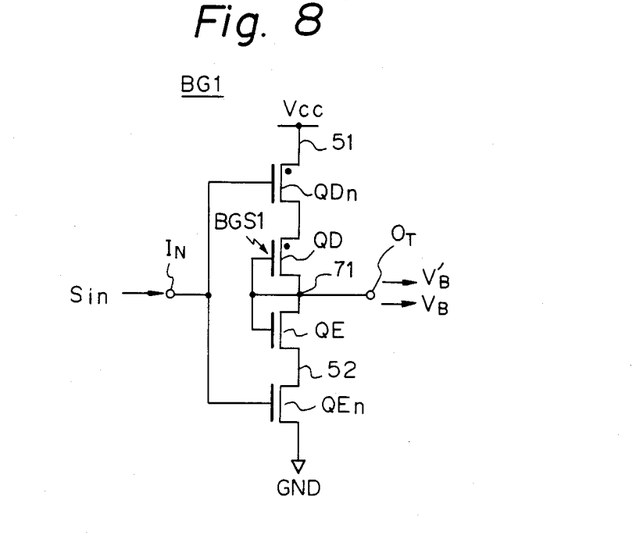
FIG. 8 illustrates a first example of a bias voltage generator according to the present invention.

FIG. 8 illustrates a first example of a bias voltage generator according to the present invention. The bias voltage generating source BGS1 of the generator BG1 is comprised of at least one pair of series-connected FET's, and an intermediate connecting point 71 is led to the output terminal $O_T$. To be specific, the bias voltage generating source BGS1 of the most preferable example is comprised of an n-channel or p-channel depletion type FET QD and an n-channel or p-channel enhancement type FET QE connected in series. The gates thereof and the point 71 are commonly connected to each other. The operation of the bias voltage generator BG1 is as follows. When the common input signal $S_{in}$ having an "H" level is sent to the input terminal $I_N$, i.e., in the active mode, both the first and second FET's, i.e., $QD_n$ and $QE_n$, are turned ON. In this case, a driving current flows through the bias voltage generating source BGS1 via the driving current paths 51 and 52. Accordingly, the source BGS1 can produce the bias voltage $V_B$, for example, 2.3 V, peculiar to the source BGS1, as in the prior art bias voltage generator BG of FIG. 5. Conversely, when the common input signal $S_{in}$ having an "L" level is sent, i.e., in the standby mode, the first and second FET's, i.e., $QD_n$ and $QE_n$, are both turned OFF. Therefore, a driving current does not flow through the generator BG1. This means that the power consumption in the standby mode can be minimized, which is an advantage identical to that obtained by the CMOS structure. In this case, as a driving current does not flow through the bias voltage generating source BGS, the source BGS per se cannot produce the inherent bias voltage $V_B$.

In the above-mentioned standby mode, however, the second FET $QD_n$ is in a conductive state, even though it is now made OFF. This is because the related FET $QD_n$ is a depletion type. That is, the depletion type FET $QD_n$ produces a certain voltage, at its source, even if the gate thereof receives an "L" level gate voltage sent by the signal $I_N$. The voltage concerned is derived from the threshold $V_{TH}$ of the FET $QD_n$. The threshold voltage of a depletion type FET usually has a negative polarity and a magnitude of 2 to 3 V, i.e., $-2$ through $-3$ V. The threshold voltage appears at point 71 through the FET QD without a voltage drop across the QD, since a driving current is not applied. As a result, a voltage equal to the aforesaid threshold voltage is produced at the output terminal $O_T$ as the voltage $V_B'$, i.e., 2 to 3 V, which is near to the inherent bias voltage $V_B$, for example, 2.3 V. Thus, although a driving current does not flow through the bias voltage generator BG1 in the standby mode, it can still produce the output voltage $V_B'$ near to $V_B$. This is the point of the present invention.

Figure 9A:
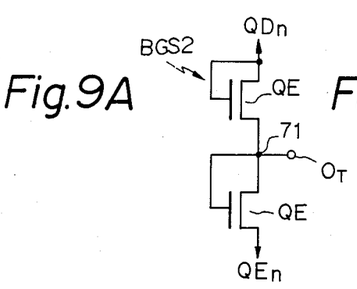
FIGS. 9A through 9E display the bias voltage generating sources used in the second through sixth examples of the bias voltage generators, respectively.
Figure 9B:
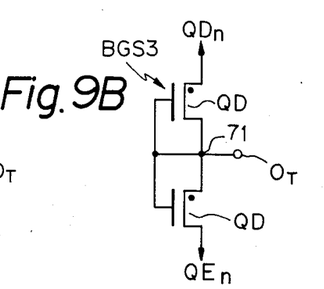
Figure 9C:
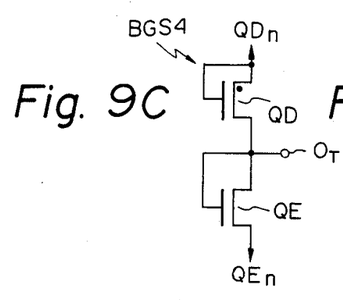
Figure 9D:
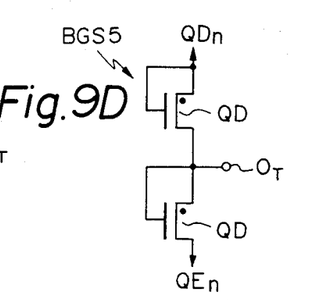
Figure 9E:
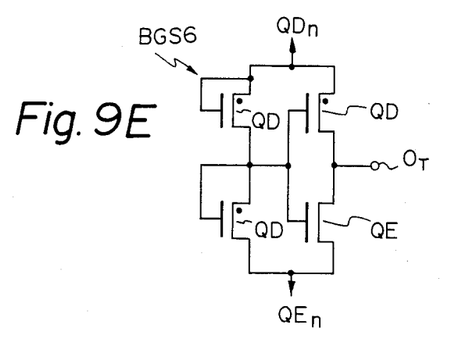

FIG. 9A through 9E display the bias voltage generating soruces used in second through sixth examples of the bias voltage generators, respectively. Each of the second through sixth bias voltage generating sources BGS2 through BGS6 is sandwiched between the first and second FET's $QD_n$ and $QE_n$ in the corresponding one of the second through sixth examples of the bias voltage generators (BG2 through BG6) but these FET's $QD_n$ and $QE_n$ are not illustrated, for brevity. The characters QE and QD represent n-channel or p-channel FET's as referred to previously. If the bias voltage generating source must be fabricated with enhancement type FET' only, the second example of FIG. 9A is used. Conversely, if the bias voltage generating source must be fabricated with the depletion type FET's only, the fifth example of FIG. 9D is used. The sixth example of FIG. 9E is superior to the others in view of the accuracy of the resultant bias voltage level obtained thereby. According to a simulation test, the inventor found that the bias voltage generating source BGS1 is most preferable from the viewpoint of low dependency with respect to $V_{cc}$ variance.

Figure 10A:
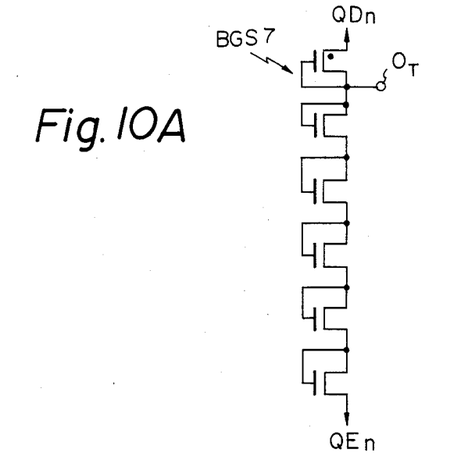
FIGS. 10A and 10B display other examples of the bias voltage generating sources (BGS's)
Figure 10B:
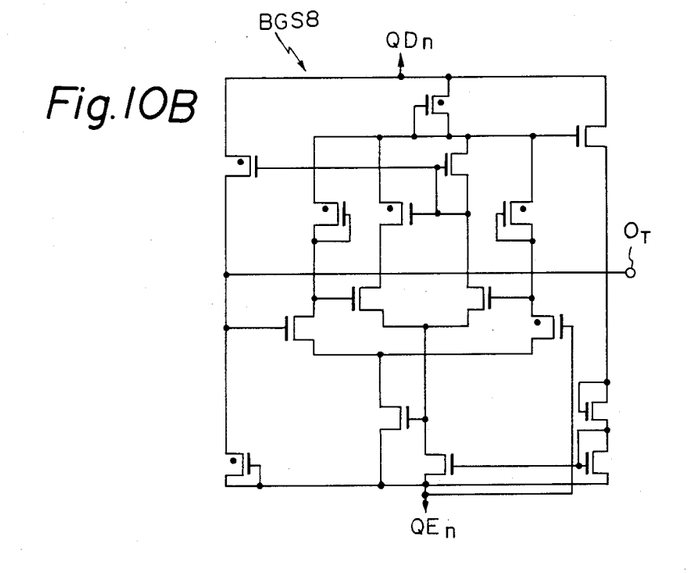

FIGS. 10A and 10B display other examples of the bias voltage generating sources (BGS's). The bias voltage generating source BGS7 of FIG. 10A has a multicascade FET construction. In the source BGS7, the output voltage at the output terminal $O_T$ is defined by the threshold voltage $V_{th}$ of an enhancement type FET QE, wherein the condition $$\frac{\left(\frac{W}{L}\right)_E}{n} >> \left(\frac{W}{L}\right)_D,$$

should be satisfied, where W denotes a channel width and L a channel length of a FET, and n a stage number of the FET's other than the FET's QD and QE. The characters D and E attached to the parentheses indicate the FED's QD and QE, respectively.

The bias voltage generating source BGS8 of FIG. 10B is constructed as a differential and precision type, but is disadvantageous from the viewpoint of a reduction in circuit size.

Returning to FIG. 7, the bias voltage generator BG employs a CMOS structure with the FET's $QD_n$ and $QE_n$. Such a CMOS structure harmonizes with recent trends in semiconductor memory circuits. This is because there is a tendency now to fabricate the semiconductor memory circuit with the CMOS devices in as many circuit blocks as possible in the semiconductor memory circuit. For example, in the semiconductor memory circuit of FIG. 1, the address buffer circuits 12, 14, the decoders 13, 15, the erase/write control circuit 21, the sense amplifier 17, and the buffer 18, each charge pump circuit (21, 22, 23) and the delay circuit 31. The latter two circuits shown in the following figures.

Figure 11:
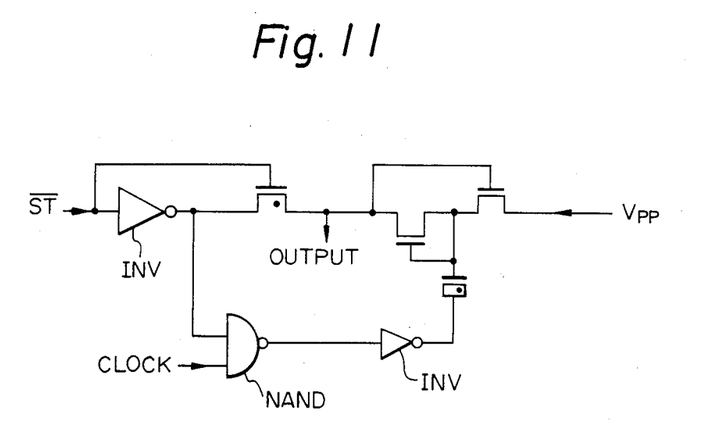
FIG. 11 is a circuit diagram of an example of a charge pump circuit.
Figure 12:
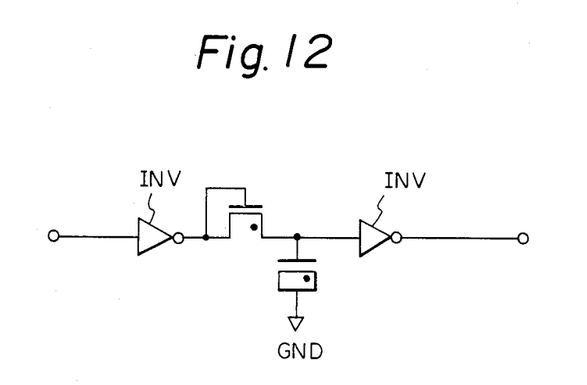
FIG. 12 is a circuit diagram of an example of a delay circuit.

FIG. 11 is a circuit diagram of an example of a charge pump circuit, and FIG. 12 is a circuit diagram of an example of a delay circuit. In FIGS. 11 and 12, the inverters INV and a NAND gate are fabricated with a CMOS structure. $\overline{ST}$ represents a suitable start signal.

Thus, the CMOS structured bias voltage generator BG according to the present invention is a good match with the CMOS structured semiconductor memory circuit.

As mentioned above in detail, the bias voltage generator can produce the output voltage near to the inherent bias voltage $V_B$ even though almost no driving current flows therethrough, i.e., in the standby mode in which power consumption, due to the driving current, should be kept as low as possible.

We claim:

1. A semiconductor memory circuit having an active mode and a standby mode, said semiconductor memory circuit comprising:
   a plurality of memory cells, each including a field effect transistor (FET) having a control gate, as a memory transistor;
   a first power supply line for supplying a first power supply voltage;
   a second power supply line for supplying a second power supply voltage; and
   a bias voltage generator, connected to said memory cells, for supplying at least a predetermined bias voltage to each said control gate in the active mode, said bias voltage generator including,
   a bias voltage generating source having a current inlet, a current outlet, and an output terminal for outputting the predetermined bias voltage when a driving current flows from the current inlet to the current outlet,
   a first FET, connected between said first power supply line and the current inlet of the bias voltage generating source, having a gate receiving a common input signal which selectively defines one of the active and standby modes, the first FET being turned on regardless of the status of the input signal, and
   a second FET, connected between said second power supply line and the current outlet of the bias voltage generating source, the second FET being turned on during the active mode and turned off during the standby mode, whereby an output voltage near to the predetermined bias voltage is supplied from the output terminal of said bias voltage generator and the driving current is cut by the second FET.

2. A semiconductor memory circuit as set forth in claim 1, wherein said first FET is an n-channel depletion type FET and said second FET is an n-channel enhancement type FET.

3. A semiconductor memory circuit as set forth in claim 2, wherein said n-channel depletion type FET has a threshold voltage which defines said output voltage to be produced in said standby mode and is near to said predetermined bias voltage.

4. A semiconductor memory circuit as set forth in claim 3, wherein said common input signal is made "H" and "L" level in response to said active mode and said standby mode, respectively, and said input signal can be substituted by a usual chip enable signal or chip selection signal.

5. A semiconductor memory circuit as set forth in claim 4, wherein said bias voltage generating source is comprised of at least one pair of series-connected FET's, an intermediate connecting point of which is led to an output terminal for producing said output voltage or said bias voltage.

6. A semiconductor memory circuit as set forth in claim 5, wherein said pair of series-connected FET's comprises a depletion type FET and an enhancement type FET, and the gates thereof are commonly connected to said intermediate connecting point.

7. A semiconductor memory circuit as set forth in claim 5, wherein said pair of series-connected FET's are depletion type FET's, and the gates thereof are commonly connected to said intermediate connecting point.

8. A semiconductor memory circuit as set forth in claim 5, wherein said pair of series-connected FET's comprise a third FET and a fourth FET, the gate of the third FET being connected to the source of said first FET and the gate of the fourth FET being connected to said intermediate connecting point.

9. A semiconductor memory circuit as set forth in claim 8, wherein said third and fourth FET's are both enhancement type FET's or both depletion type FET's.

10. A semiconductor memory circuit as set forth in claim 8, wherein said third and fourth FET's are depletion type and enhancement type FET's, respectively.

11. A semiconductor memory circuit as set forth in claim 5, wherein said pair of series-connected FET's are a depletion type FET, at said current inlet of said bias voltage generating source, and an enhancement type FET, at said current outlet of said bias voltage generating source, both FET's having commonly connected gates, the pair of series-connected FET's are further connected in parallel with another pair of series-connected FET's set which are both depletion type FET's, one of said depletion type FET's having a gate connected with the drain thereof, and the other of said depletion type FET's having a gate connected with the drain thereof and also with said commonly connected gates.

* * * * *